(12) United States Patent
Idemura et al.

(10) Patent No.: US 7,141,627 B2
(45) Date of Patent: Nov. 28, 2006

(54) EPOXY RESIN COMPOSITION

(75) Inventors: Satoshi Idemura, Sakura (JP); Masao Yamada, Ichihara (JP); Koichi Fujimoto, Chiba (JP); Katsuji Takahashi, Sakura (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 275 days.

(21) Appl. No.: 10/693,693

(22) Filed: Oct. 27, 2003

(65) Prior Publication Data

US 2004/0110908 A1 Jun. 10, 2004

(30) Foreign Application Priority Data

Oct. 31, 2002 (JP) ............................. 2002-317672

(51) Int. Cl.
*C08G 63/181* (2006.01)
*C08G 63/19* (2006.01)
*C08G 63/193* (2006.01)
*C08L 63/00* (2006.01)
*C08L 63/04* (2006.01)

(52) U.S. Cl. .................... 525/438; 528/298; 528/299; 528/300; 528/305; 528/307; 528/308.7

(58) Field of Classification Search .................. None
See application file for complete search history.

(56) References Cited

U.S. PATENT DOCUMENTS 4,430,462 A 2/1984 Jaeger et al. ............... 523/402

5,362,820 A 11/1994 Moens et al. ............... 525/438

FOREIGN PATENT DOCUMENTS

| JP | 54124057 A | * | 9/1979 |
| JP | 63295620 A | * | 12/1988 |
| JP | 5-51517 |   | 3/1993 |
| JP | 05051517 A | * | 3/1993 |
| JP | 2002-12650 |   | 1/2002 |
| JP | 2002012650 A | * | 1/2002 |

* cited by examiner

*Primary Examiner*—Robert Sellers
(74) *Attorney, Agent, or Firm*—Armstrong, Kratz, Quintos, Hanson & Brooks, LLP

(57) ABSTRACT

An epoxy resin cured article has a high glass transition temperature and low dissipation factor. An epoxy resin composition from which the cured article can be having excellent solubility in solvents is used to produce the cured articles. A polyester as a curing agent of an epoxy resin composition having an aromatic polyhydroxy coumpound residue including an aryloxycarbonyl group at the molecule of the terminal, an aromatic polyvalent hydrocarbon group residue, and bulky structure, is used. Since the curing agent behaves as a polyfunctional curing agent, a cured article produced therefrom has a high crosslink density. Since highly polar hydroxyl groups are not formed during curing, a cured article has high glass transition temperature and a low dissipation factor. The cured article does not release low molecular weight carboxylic acids though hydrolysis of ester bonds at crosslinked bonds. Since the polyester has a bulky structure, the crystallization of the molecular chain is prevented and the solubility of the epoxy resin composition containing the polyester is excellent.

5 Claims, No Drawings

EPOXY RESIN COMPOSITION

BACKGROUND OF THE INVENTION

1. Field of the Invention

The invention relates to epoxy resin compositions which may be used to manufacture cured products which exhibit low dissipation factor and high heat resistance, and relates to cured products made therewith.

Priority is claimed on Japanese Patent Application No. 2002-317672, filed Oct. 31, 2002, the content of which is incorporated herein by reference.

2. Description of Related Art

Epoxy resins are widely used in the fields of electrical components and electronic components exemplified by semiconductor encapsulants, varnishes for printed circuit boards, and resist materials, since epoxy resins have excellent properties in electrical insulation, mechanical properties, and adhesive properties. In fields such as electrical components and electronic components, phenol resins such as phenol-novolak resins and amines such as dicyandiamide, and acid anhydrides curing agent are widely used as curing agents of epoxy resins.

However, high frequency bands are suitable to carry much information being tele-communicated recently in electrical components and electronic components exemplified printed circuit boards, and other electric insulation resist materials. For this reason, it is desired to present epoxy resin systems with a low dissipation factor to decrease the transmission loss in high frequency bands. However, when phenol resins, amine type curing agents, and anhydride curing agents are used, which are widely used as curing agents for epoxy resins, it was difficult to decrease the transmission loss since highly polar hydroxyl groups are formed in the curing reaction with epoxy resins.

Consequently, a curing agent which does not form hydroxyl groups during a curing reaction, for example, an aromatic polyester as the esterification reaction product of an aromatic dicarboxylic acid and an aromatic dihydroxy compound, is known from Japanese Unexamined Patent Application, First Publication No. Hei 5-51517. When this type of aromatic polyester is used as a curing agent, it is possible to minimize the formation of hydroxyl groups during the curing reaction as well as maximize the crosslinking density of the epoxy resin cured articles since this curing agent acts as a polyfunctional curing agent which has many ester groups per molecule and accordingly, the glass transition temperature is high and the material is useful as electrical insulating materials for electrical components and electronic components.

However, hydroxyl groups or carboxyl groups remain in cured articles because the aromatic polyesters at terminals of molecular chains are polar groups which are hydroxyl groups or carboxyl groups. When the hydroxyl groups remain, the hydroxyl groups markedly increase the dissipation factor. When the carboxyl groups remain, the carboxyl groups react with unreacted epoxy groups, and then hydroxyl groups are also formed. The existence of these hydroxyl groups caused a problem of increasing the dissipation factor.

As another technique for applying the ester resin which forms neither hydroxyl groups nor carboxyl groups at the terminals of curing agents for epoxy resin, a technique to lower the dissipation factor of the cured articles using an aromatic ester composition obtained by the reaction of naphthalenedicarboxylic acid and α-naphthol as curing agents for epoxy resin is known as claimed in claim 6 and disclosed in synthesis example 5 of Japanese Unexamined Patent Application, First Publication No. 2002-12650.

However, although the dissipation factor of the aromatic ester compounds is reduced, those ester compounds have only a few ester groups per molecule and thereby, the volume fraction of the inert terminal groups is increased. Since these terminal groups do not form crosslinking in the curing reaction, the concentrated terminal groups bring about decreased crosslinkng density in the cured articles that are inferior in heat resistance.

SUMMARY OF THE INVENTION

Therefore, an object of the present invention is to provide an epoxy resin system which has low dissipation factor and efficient heat resistance so as to be suitable for insulating materials for electrical components and electronic components.

To achieve the above object, the present inventors have intensively researched and found that when an aromatic hydrocarbon is an aromatic polyester bonded via an ester bond and aryloxycarbonyl groups are introduced into the aromatic hydrocarbon of the aromatic polyester at the terminal, the heat resistance of epoxy resin cured articles is improved and the dissipation factor is significantly reduced. Thus, the present invention has been completed.

The present invention relates to an epoxy resin composition comprising essential components of an epoxy resin and a curing agent which is an aromatic polyester having a structure in which an aromatic hydrocarbon group (a1) having a bonding site in an aromatic nucleus and another aromatic hydrocarbon group (a2) having a bonding site in an aromatic nucleus are bonded via an ester bond (b), and also has a structure in which an aryloxycarbonyl group (c) is the terminal of said polyester.

Epoxy resins used in the present application include novolak type epoxy resins which are glycidyl-etherified from novolak resins such as cresol novolak, phenol novolak, α-naphthol novolak, β-naphthol novolak, bisphenol A novolak, biphenyl novolak, liquid bisphenol type epoxy resins in glycidyl-etherified from bisphenol such as bisphenol A, bisphenol F, bisphenol S, tetrabromobisphenol A, 1,1-bis(4-hydroxyphenyl)-1-phenylethane and solid bisphenol A type epoxy resins which molecular weight is increased by reaction with liquid bisphenol A type epoxy resins and the above bisphenols, hydrogenated nucleus of liquid or solid bisphenol A type epoxy resins, biphenol, biphenyl type epoxy resins glycidyl-etherified from biphenol such as tetramethylbiphenol, polyglycidyl ether of phenol resin in which phenols such as polyglycidyl ethers which are addition polymers of dicyclopentadien and phenol, are linked by condensed polyalicyclic hydrocarbons, epoxy resin including condensed polycyclic aromatic groups such as diglycidyl ethers of naphthalenediol, diglycidyl ethers of binaphthol and diglycidyl ethers of bis(hydroxy naphthyl) methane, glycidyl esters of hexahydrophthalic anhydride, glycidyl esters of dimer acid, glycidyl amine of diaminodiphenylmethane, benzopyran type epoxy resins which are bonded to glycidyl oxy groups with a benzopyran composition such as dibenzopyran, hexamethyl benzopyran and 7-phenylhexamethyl benzopyran.

As a resin as an example of a novolak epoxy resin generally used in a semiconductor encapsulant in the above epoxy resins, excellent heat resistance and low dissipation factor can be exhibited in the cured articles by this invention.

Polyglycidyl ethers of phenol resins having a structure in which phenols are bonded to other phenols via a condensed polyalicyclic hydrocarbon exhibit heat resistance, outstanding mechanical strength, sufficient toughness, and in addition solder cracking resistance is excellent and a high degree of filling is possible for semiconductor encapsulants because of low melt viscosity. The condensed polyalicyclic hydrocarbon has heat resistance and low dissipation factor and in addition has excellent moisture resistance and solder cracking resistance in semiconductor encapsulant and printed circuit board materials. Benzopyran type epoxy resins exhibit excellent properties of heat resistance, dielectric properties, and flame resistance.

In these materials, benzopyran type epoxy resins and polyglycidyl ether of phenol resin in which phenols are linked by condensed polyalicyclic hydrocarbons, are preferable since they can be used for preventing the warping after molding in the application of a single sided encapsulation type package such as a ball grid alley type semiconductor because of excellent heat resistance due to high glass transition temperature of cured articles and these are used in printed-wiring assemblies because of the excellent dimensional stability of multilayer boards. In particular, a polyglycidyl ether of a phenol resin in which phenols are linked by condensed polyalicyclic hydrocarbons, is remarkably preferable in view of excellent moisture resistance as mentioned above and solder cracking resistance at the same time.

In the present application, an aromatic polyester, which is a curing agent of the epoxy resin, has a structure in which an aromatic hydrocarbon group (a1) having a bonding site in an aromatic nucleus and another aromatic hydrocarbon group (a2) having a bonding site in an aromatic nucleus are bonded via an ester bond (b), and also has a structure wherein an aryloxycarbonyl group (c) bonded at a molecule terminal thereof. Here, the ester bonding of the aromatic polyester is suitable for use in a curing agent of an epoxy resin since this bonding has a high lability to an epoxy group. Furthermore, the ester bonding of aromatic polyesters does not form highly polar hydroxyl groups when the curing reaction and the epoxy resin cured articless as reaction products exhibit indicate low dissipation factor. Moreover, since the terminal of the molecule is aryloxycarbonyl (c), although the ester bonding at the crosslink point of epoxy resin cured articles which is obtained by the reaction is hydrolyzed by moisture absorption, ester bonds do not release low molecular weight carboxylic acid molecules which would increase the dissipation factor and the obtained epoxy resin cured articles exhibit low dissipation factor under high moisture conditions.

Here, the aromatic hydrocarbon group (a1) and the aromatic hydrocarbon group (a2) is a polyfunctional group which dehydrogenated plural hydrogen atoms from an aromatic hydrocarbon nucleus including an aromatic nucleus such as a benzene ring and a naphthalene ring. Meanwhile, the structure may include ether bonds, methylene groups, ethylidene groups, and 2,2-propylene, and the structure may have halogen atoms such as chlorine atoms and bromine atoms, and methylene groups on the aromatic nucleus. Specific examples are phenylene groups (i) such as o-phenylene, m-phenylene and p-phenylene, biphenylene groups (ii) such as 4,4'-biphenylene and 3,3'-dimethyl-4,4'-biphenylene, 2,2-propane-diphenyl group, aromatic hydrocarbon group including aralkyl group (iii) represented by the following structural formulas,

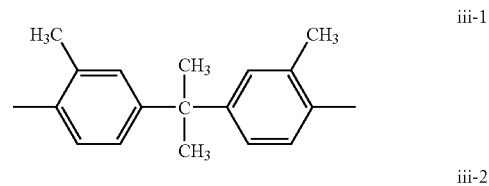

iii-1

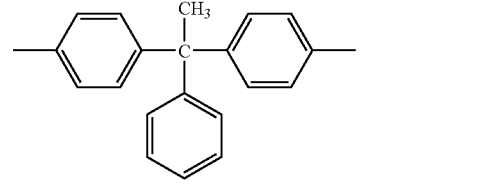

iii-2

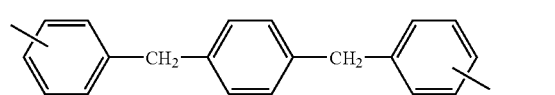

iii-3

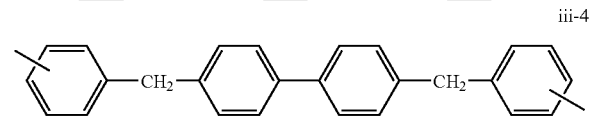

iii-4 polyvalent hydrocarbon groups (iv) having a structure in which benzene rings are bonded to other benzene rings via condensed polyalicyclic hydrocarbon represented by the following structural formulas,

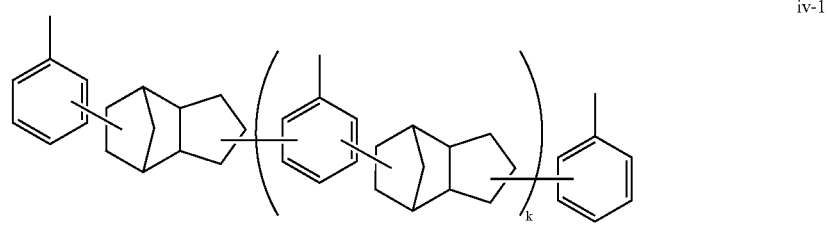

iv-1

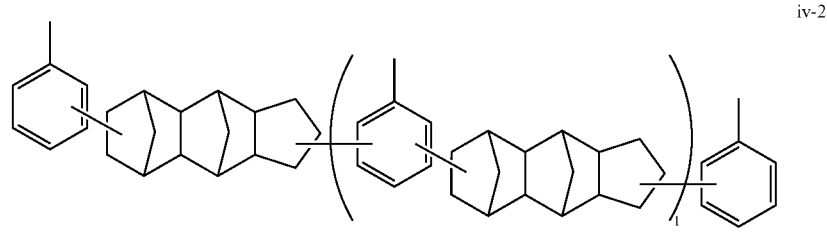

iv-2

(k in the above structural formula iv-1 is an integer, 1 in the structural formula iv-2 is an integer and these numbers are 0 to 1.5 on average; the condensed polyalicyclic hydrocarbon groups in the structural formulas iv-1' and iv-2' are formed by addition of aromatic nucleus to raw material of unsaturated compound), naphthalene groups such as 1,6-naphthalene, 2.7-naphthalene, 1,4-naphthalene, 1,5-naphthalene, 2,3-naphthalene, and bivalent hydrocarbon groups (v) having a naphthalene skeleton represented by the structural formulas shown below, v-1

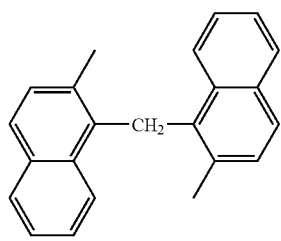

v-2

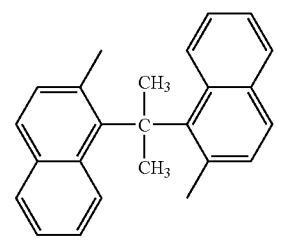

v-3

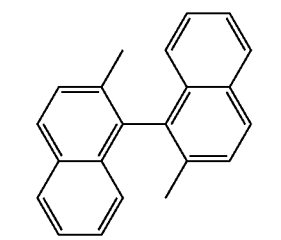

and bivalent aromatic hydrocarbon groups (vi) having a structure of dibenzopyran represented by the following General Formula 1, General Formula 1

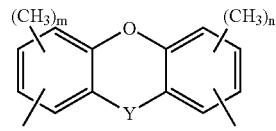

(in the General Formula 1, wherein Y represents an oxygen atom, methylene group, methylene group substituted with alkyl groups, phenyl groups, biphenyl groups or naphthyl group, and the biphenyl groups or naphthyl groups are further substituted at the aromatic nucleus with alkyl groups; each of n and m is an integer from 1 to 3.)

Specific examples represented by the General Formula 1 may include the structural formulas shown below.

vi-1

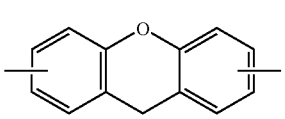

vi-2

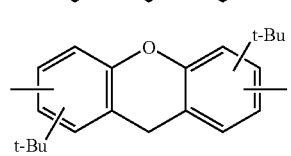

vi-3

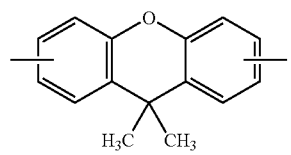

vi-4

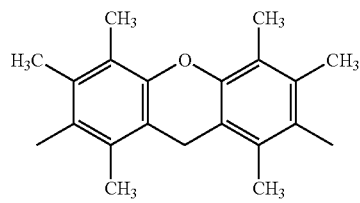

vi-5

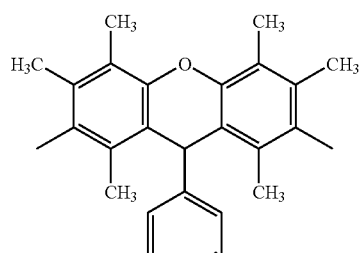

vi-6

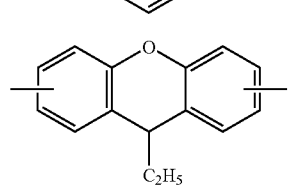

vi-7

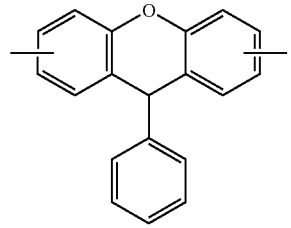

vi-8

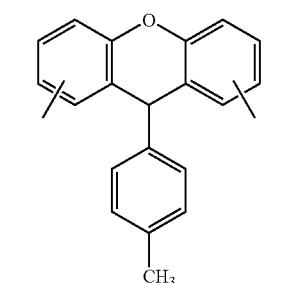

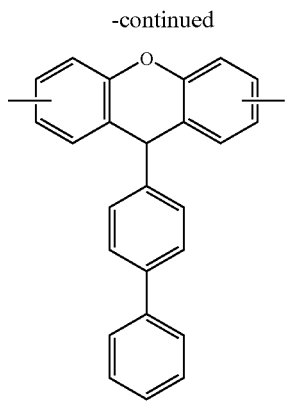

vi-9

Particularly in the aromatic hydrocarbon group detailed above, polyvalent hydrocarbon groups (iv) having a structure in which benzene rings are bonded to other benzene rings via a condensed polyalicyclic hydrocarbon, bivalent hydrocarbon groups (v) having a naphthalene skeleton, and bivalent aromatic hydrocarbon groups (vi) having a structure of dibenzopyran are preferable since these have excellent dissipation factor. Specifically, the dissipation factor at 1 GHz is less than $5.0 \times 10^{-3}$ and this composition is suitable for electrical components and electronic components using high frequencies which are highly required today. The rate of change of dissipation factor by moisture absorption after a pressure cooker test for 2 hours at 121° C. was evaluated, and this composition shows a stable low dissipation factor even when the humidity conditions changed.

Specifically, hydrocarbon groups (iv) having a structure in which benzene rings are bonded to other benzene rings via a condensed polyalicyclic hydrocarbon, is preferable in view of heat resistance, dielectric properties, and in addition, excellent moisture resistance, and it is suitable for semiconductor encapsulant and printed-wiring assembly. In particular, compounds represented by formula iv-1, chosen from iv-1 and iv-2, are preferable since these characteristics are well balanced.

Bivalent hydrocarbon groups (v) having a naphthalene skeleton are excellent in heat resistance, toughness, and mechanical properties when used to form a cured article. Specifically, binaphthylene represented by the structural formula v-3 is preferable since these characteristics are dominant.

Moreover, the bivalent aromatic hydrocarbon groups (vi) having a structure of dibenzopyran are suitable for the application of the printed-wiring assembly since these compounds exhibit excellent flame resistance.

The hydrocarbon group (iv) in these groups is preferable since it has significant performance in which the dielectric properties are low under a humid atmosphere.

Furthermore, the aromatic hydrocarbon groups (a1) and the aromatic hydrocarbon groups (a2) may be the same or may be different. It is preferable that the aromatic hydrocarbon group (a1) be selected from the hydrocarbon groups (iv), the hydrocarbon groups (v), and the aromatic hydrocarbon groups (vi), and the aromatic hydrocarbon group (a1) be a phenylene group in view of ease of production of aromatic polyester and excellent solubility in organic solvents.

Next, the molecule terminal of an aromatic polyester comprising aryloxy carbonyl group (c) may include halogen atoms such as chlorine atoms and bromine atoms, and methyl groups, 2-propyl groups, and phenoxy groups as substituents on benzene rings and naphthalene rings in the structure. Specifically, the following structure is preferable in view of heat resistance and dielectric properties.

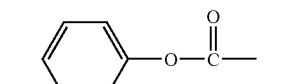
c-1

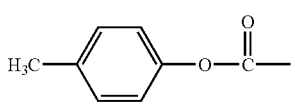
c-2

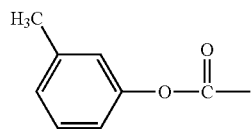
c-3

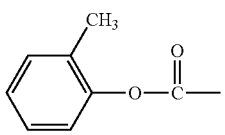
c-4

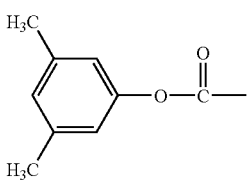
c-5

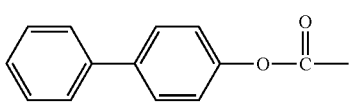
c-6

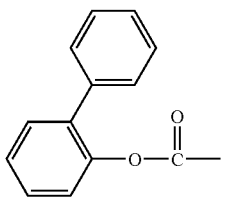
c-7

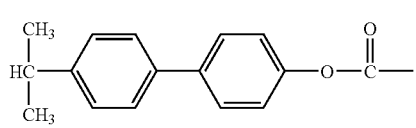
c-8

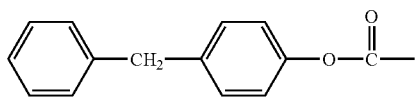
c-9

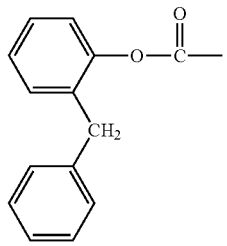
c-10 c-11
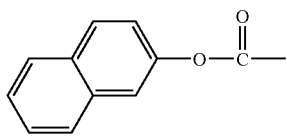

c-12
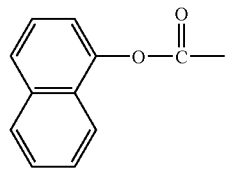

c-13
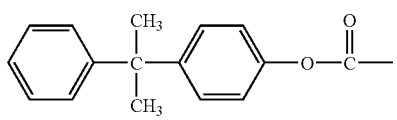

The structure including a naphthalene skeleton represented by the formula c-11 and formula c-12 in the above structure, and biphenyloxycarbonyls represented by formula c-6 and c-7 are preferable since these exhibit notably low dielectric properties. The number of aryloxycarbonyl (c) groups in the aromatic polyester is reduced since the aromatic polyester is a high molecular weight compound per se. Since the terminal aryl moiety of aryloxycarbonyl(c) groups do not form the intermolecular crosslink networks in the curing reaction with epoxy resin, a reduced concentration of aryloxycarbonyl (c) groups result in a high crosslinking density, thereby, an elevated glass transition temperature.

The following structure is exemplified in the case in which phenylene groups (i) in these aromatic polyesters, bonded via ester bond (b) with hydrocarbon groups (iv) having a structure in which other benzene rings, are bonded via a condensed polyalicyclic hydrocarbon.

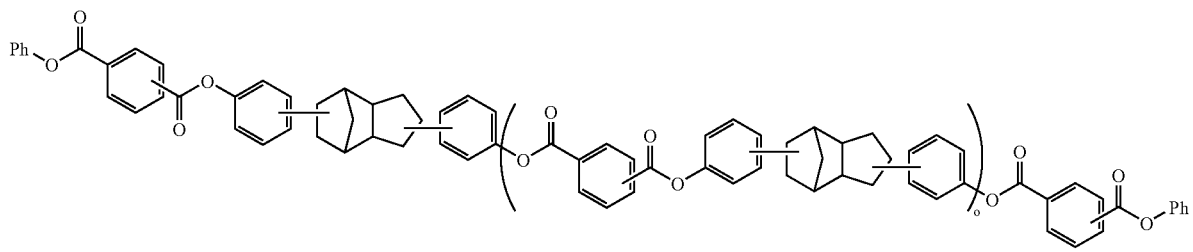

(wherein Ph represents phenyl, biphenyl, or naphthyl and o is an integer which is 0.4 to 20 on average and condensed polyalicyclic hydrocarbon in the formula is formed by addition of aromatic nucleus to raw material of an unsaturated compound.)

Furthermore, an aromatic polyester which has a bonded phenylene group (i) with bivalent hydrocarbon groups (v) having a naphthalene skeleton via ester bonding (b) is exemplified in the following structure.

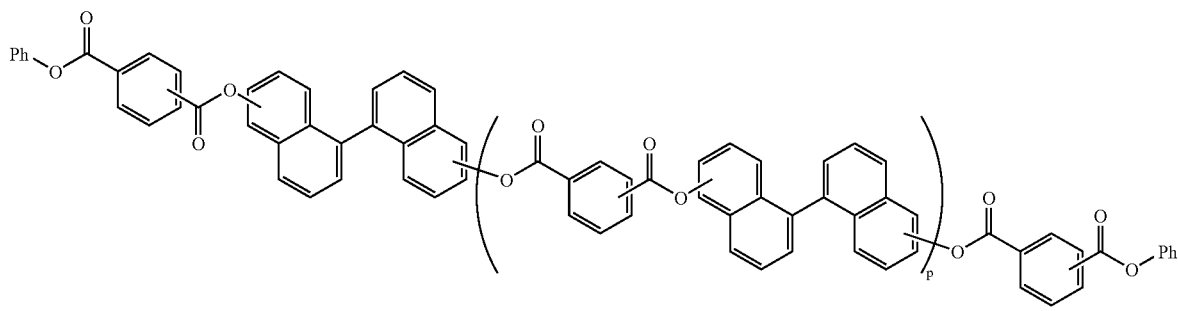

(wherein Ph represents phenyl, biphenyl, or naphthyl and p is an integer which is 0.4 to 20 on average.)

Moreover, the aromatic polyester which bonded phenylene group (i) with bivalent aromatic hydrocarbon groups (vi) having a structure of dibenzopyran represented by the formula vi-5 is exemplified in the following structure.

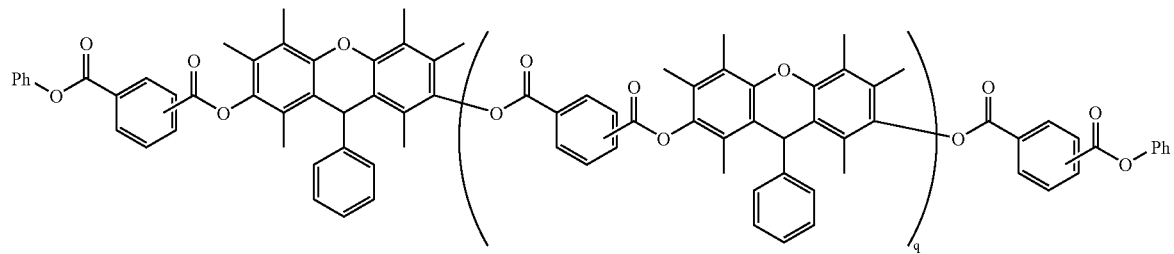

(wherein Ph represents phenyl, biphenyl, or naphthyl, and q is an integer which is 0.4 to 20 on average.)

It is preferable that the inherent viscosity of the aromatic polyester detailed above be within a range of 0.02 to 0.42 dL/g since it has good heat resistance due to high crosslink density in cured articles as mentioned above. Moreover, in a case in this range of inherent viscosity, the solubility in toluene and methyl ethyl ketone (MEK) which is used in adjustment of varnish for printed circuit boards is good and in addition, this good solubility can prevent precipitation of crystals. Furthermore, in the case within this range of the inherent viscosity when applied to a semiconductor encapsulant, it becomes possible to obtain a high degree of filling of the filler because of good fluidity when melted.

Specifically, the solubility in methyl ethyl ketone (MEK) and toluene is better in the case in which the inherent viscosity of the aromatic polyester is within a range of 0.03 to 0.15 dL/g. Moreover, the aromatic polyester having the inherent viscosity within this range can be dissolved up to 50 wt % in methyl ethyl ketone (MEK) and toluene. This 50 wt % solution is homogeneous, transparent, and stable at room temperature. This aromatic polyester exhibits excellent solubility, without any participation of solid, after repeated the thermal cycle test, which cycle the steps in which a 50 wt % solution is left for 5 hours at 25° C. and is then left for 11 hours at −20° C. The polyester has an advantage of thermal processing since it melts and softens at 200° C. or less without any solvent. The aromatic polyester is formed by polycondensation of esterification reaction polyhydric phenol (a'-1) bonded to the aromatic hydrocarbon groups (a1) or the aromatic hydrocarbon groups (a2) with hydroxyl group, and polyvalent carboxylic acid (a'-2) bonded to the aromatic hydrocarbon groups (a1) or the aromatic hydrocarbon groups (a2) with carboxyl groups. Then, the aromatic polyester is produced by esterification of the terminal carboxyl groups of the above polycondensed intermediate and monohydric phenol (c') bonded aryl groups which is the aryloxycarbonyl groups (c) with hydroxyl groups.

The aromatic polyester may be produced by ester exchange reaction and Schotten-Baumann reaction. An example of an ester exchange reaction is one in which the aromatic polyester is obtained by the step of acetylation of polyhydric phenol and monohydric phenol (c') by acetic anhydride and the step of acidolysis of the acetylation result and the polyvalent carboxylic acid (a'-2). Since the reactivity is low in these esterification reactions in general, ester exchange reaction and Schotten-Baumann reaction are preferable.

When the Schotten-Baumann reaction is used, there may be mentioned an interfacial polycondensation method which is implemented at a boundary face and asolution polycondensation method which reaction is implemented in a homogeneous solution. In the interfacial polycondensation method, an aromatic polyester is obtained by the contact of an organic liquid phase including acyl halide of polyvalent carboxylic acid (a'-2) and an aqueous phase including monohydric phenol (c'), and then interfacial polycondensation in the presence of an acid acceptor. In the solution polycondensation method, aromatic polyester is obtained by hydrohalogenation reaction mixing of a solution including acid halide of polyvalent carboxylic acid (a'-2) and a solution including polyhydric phenol (a'-1) and monohydric phenol (c') in the presence of an acid acceptor.

A method for producing aromatic polyester used in the present invention applying the Schotten-Baumann reaction as an example is described specifically below. Any compounds which have a bond with the above aromatic hydrocarbon groups represented by the formulas (i) to (vi) with the hydroxyl group may be used as polyhydric phenol (a'-1) used in the manufacture of aromatic polyester and the compound bonded hydroxyl group with the compound which is bonded with the hydroxyl group with polyvalent hydrocarbon groups (iv) having a structure in which the benzene rings are bonded to other benzene rings via a condensed polyalicyclic hydrocarbon is preferable since moisture resistance is excellent and dissipation factor can be further reduced. An example of these compounds is shown in the following structural formula.

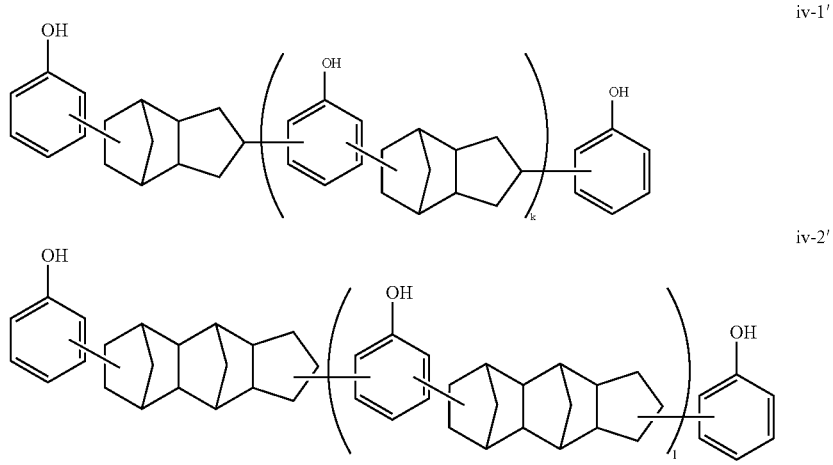

k in the formula iv-1' and l in the formula iv-2 are integers which are 0 to 1.5 on average. The condensed polyalicyclic hydrocarbon groups in the structural formulas iv-1' and iv-2' are formed by addition of aromatic nucleus to the raw material of an unsaturated compound. A specific example is dicyclopentadiene type phenol resin represented by the formula iv-1' in these formulas since this resin is excellent in moisture resistance and exhibits stable dielectric properties under high moisture conditions. Specifically, the average of k and l is within a range of 0 to 0.2 in view of antigelling characteristics.

Polyhydric phenols having a structure in which bivalent hydrocarbon groups (v) having a naphthalene skeleton bonded to a hydroxyl group are preferable since these are excellent in heat resistance and yield cured articles in which the dissipation factor is low. Examples of these polyhydric phenols are dihydroxynaphthalenes such as 1,6-dihydroxynaphthalene groups, 2-7-dihydroxynaphthalene groups, 1,4-dihydroxynaphthalene, 1,5-dihydroxynaphthalene, 2,3-dihydroxynaphthalene, and the following structures.

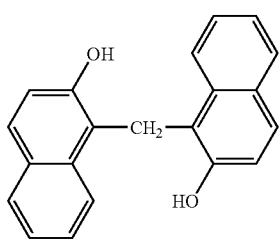

v-1'

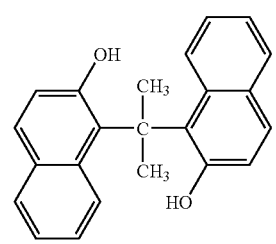

v-2'

-continued

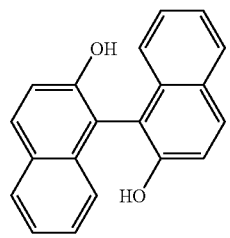

v-3'

Moreover, polyhydric phenol bonded hydroxyl groups with bivalent aromatic hydrocarbon groups (vi) having a structure of the dibenzopyran is preferable since the effect of reducing the dissipation factor is remarkable. These polyhydric phenols are exemplified by the following General Formula 2.

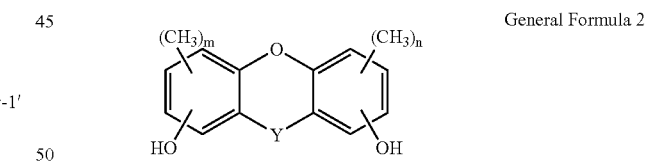

General Formula 2

(wherein Y represents an oxygen atom, methylene group, methylene group substituted with alkyl groups, phenyl groups, biphenyl groups or naphthyl group, and the biphenyl groups or naphthyl groups are further substituted at the aromatic nucleus with alkyl groups; each of n and m is an integer from 1 to 3.) These structures represented by General Formula 2 are exemplified by the following structures.

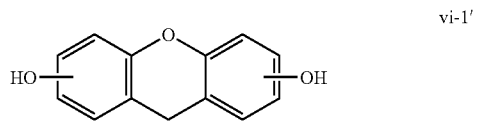

vi-1' vi-2' 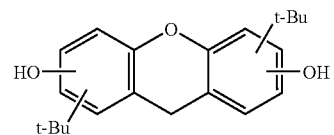

vi-3' 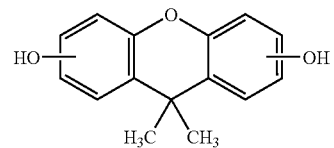

vi-4' 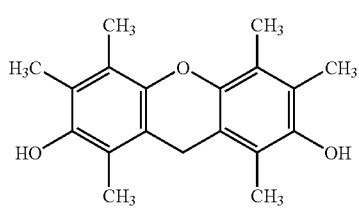

vi-5' 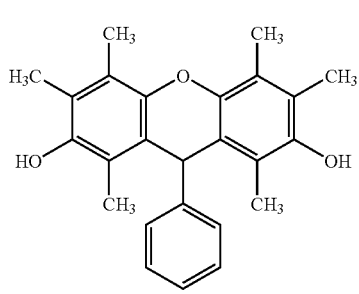

vi-6' 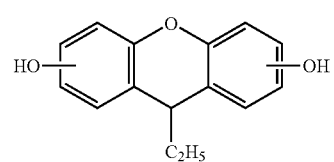

vi-7' 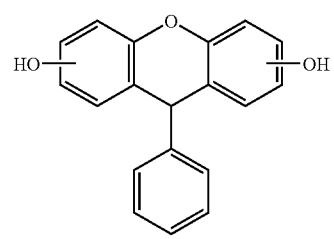

vi-8' 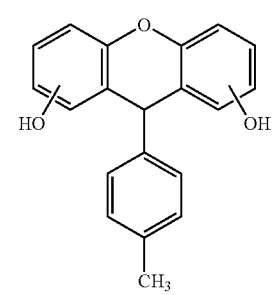

vi-9' 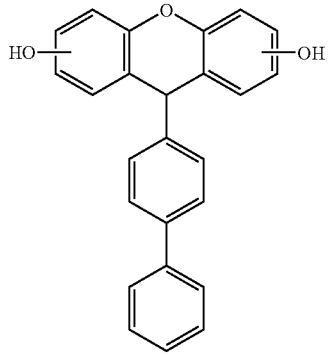

Any compounds which have bonds as in the above aromatic hydrocarbon represented by the formulas (i) to (vi) with a carboxyl group may be used as a polyvalent carboxylic acid (a'-2) reacted with a polyhydric phenol (a'-1)

Examples of polyvalent hydrocarbon compounds bonded phenylene groups (i) with carboxyl groups are isophthalic acid, terephthalic acid, trimesic acid, trimellitic acid, and pyromellitic acid. An example of polyvalent hydrocarbon groups bonded biphenylene groups (ii) with carboxyl groups is biphenylenedicarboxylic acid. Examples of polyvalent hydrocarbon compounds bonded aromatic hydrocarbon group including aralkyl group (iii) with carboxyl groups are compounds represented by the following General Formula 3 and compounds having a structure which includes a nucleus substituted with methyl groups, ethyl groups, or halogen atoms.

General Formula 3

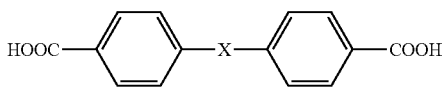

(wherein X represents —CH$_2$— and —C(CH$_3$)$_2$—.)

Examples of polyvalent hydrocarbon compounds with carboxyl groups bonded to polyvalent hydrocarbon groups (iv) having a structure in which benzene rings are bonded to other benzene rings via a condensed polyalicyclic hydrocarbon are compounds in which a repeating unit in structural formula iv-1 is bonded to carboxyl groups and compounds in which structural formula iv-1 is bonded to carboxyl groups. Examples of polyvalent hydrocarbon compounds bonded carboxyl groups with bivalent hydrocarbon groups (v) having a naphthalene skeleton are 1,4-naphthalenedicarboxylic acid, 2,3-naphthalenedicarboxylic acid and 2,6-naphthalenedicarboxylic acid. An example of polyvalent hydrocarbon compounds bonded carboxyl groups with bivalent aromatic hydrocarbon groups (vi) having a structure of dibenzopyran is a compound represented by the following General Formula 4.

General Formula 4

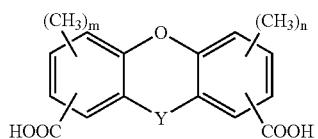

(wherein Y represents an oxygen atom, methylene group, methylene group substituted with alkyl groups, phenyl groups, biphenyl groups or naphthyl group, the biphenyl groups or naphthyl groups being optionally further substituted at the aromatic nucleus with alkyl groups; each of n and m is an integer from 1 to 3.)

Specifically, compounds having a structure of carboxyl groups at the bonding site of the structures are represented by the above vi-1 to vi-9. Since the solubility of aromatic polyester in organic solvents such as methyl ethyl ketone (MEK) and toluene is good for keeping the dissipation factor low, and the cured articles exhibit high glass transition temperature and low dissipation factor, polyvalent hydrocarbon compounds bonded carboxyl groups with mononuclear aromatic hydrocarbon groups and polyvalent hydrocarbon compounds bonded carboxyl groups with biphenylene groups (ii), specifically biphenylenedicarboxylic acid, are preferable in these structures. Aromatic polyester obtained from isophthalic acid or a mixture of isophthalic acid and terephthalic acid is excellent in solubility to various solvents. Specifically, it is preferable to use only isophthalic acid when the inherent viscosity is less than approximately 0.2 dL/g and to use a mixture of isophthalic acid and terephthalic acid when inherent viscosity is 0.2 dL/g or more.

The carboxylic acid (a'-2) is used as acyl halide when aromatic polyester is manufactured by Schotten-Baumann reaction. The halogen atoms of acyl halide in this case, chlorine atoms, and bromine atoms are preferable.

In the structure of monohydric phenol (c'), a substituent on the benzene ring and naphthalene ring may be halogen atoms such as chlorine atoms and bromine atoms, methyl groups 2-propyl groups and phenoxy groups, and specifically, the following structure is preferable in view of heat resistance and dielectric properties.

c'-1

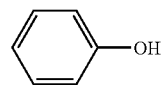

c'-2

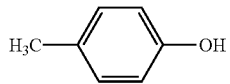

c'-3

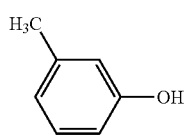

c'-4

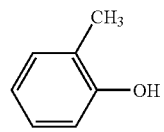

c'-5

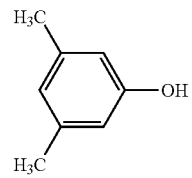

c'-6

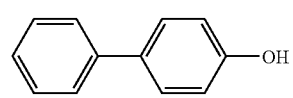

c'-7

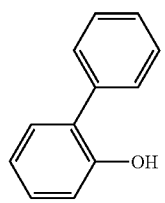

c'-8

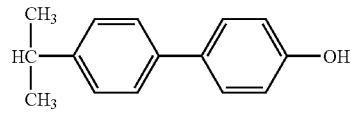

c'-9

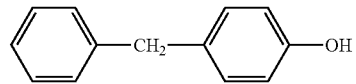

c'-10

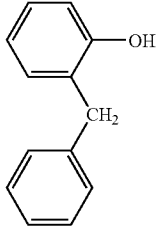

c'-11

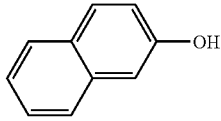

c'-12

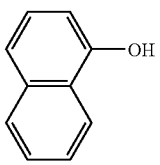

c'-13

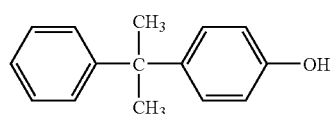

Structures including a naphthalene skeleton represented by formula c'-11 and formula c'-12 and structures including a biphenyl skeleton represented by formulas c'-6 and c'-7 are preferable in the above structures since they can exhibit especially low dissipation factor. In these structures, c'-12 is preferable since polyesters derived therefrom show ontstanding solubility in organic solvents.

As solvents for the organic solution phase in a production process of aromatic polyester by interfacial polycondensation method, solvents which dissolve acyl halide of carboxylic acid (a'-2), which are chemically stable against acyl halide, and which are not compatible with water, are preferable; for example, toluene and dichloromethane are preferable. Polyhydric phenol (a'-1) and an alkaline substance which is an acid acceptor are dissolved in an aqueous phase.

As solvents for the production process by solution polycondensation method, solvents which dissolve acyl halide of carboxylic acid (a'-2), polyhydric phenol (a'-1) and monohydric phenol (c') and which is chemically stable against acyl halide and, for example, toluene and dichloromethane, are preferable. Examples of the acid acceptor used for a polycondensation reaction are pyridine and triethylamine.

The ratio of reaction of each of the above raw material components differs according to desired inherent viscosity, and when producing an aromatic polyester having an inherent viscosity of 0.02 to 0.42 dL/g, it is preferable that the equivalence ratio of polyhydric phenol (a'-1), carboxylic acid (a'-2) and the monohydric phenol (c') be within a range of polyhydric phenol (a'-1)/carboxylic acid (a'-2)=0.28 to 0.95 and polyhydric phenol (a'-1)/monohydric phenol (c')=0.20 to 10.

To reduce the content of impurities in the obtained aromatic polyester, purification by washing and reprecipitation is preferable. When the impurities such as monomers, halogen ions, alkali metal ions, alkali earth metal ions and salts remain in the aromatic polyester, these impurities affect adversely affect the dissipation factor and other electrical properties.

Epoxy resin compositions of the present invention may use the epoxy resins, the aromatic polyesters and hardening accelerators. Examples of the hardening accelerator are imidazole compounds such as 2-methylimidazole, 2-ethyl-4-methylimidazole, 1-benzyl-2-methylimidazole, 2-heptadecylimidazole, 2-undecylimidazole, organic phosphine compounds such as triphenylphosphine, tributylphosphine, organic phosphite compounds such as trimethyl phosphite, triethyl phosphite, phosphonium salts such as ethyltriphenyl phosphonium bromide, tetraphenyphosphonium tetraphenylborate, trialkylamine such as triethylamine, tributylamine, amine compounds such as 4-(dimethylamino) pyridine, benzyldimethylamine, 2,4,6-tris (dimethylaminomethyl)phenol, 1,8-diazabicyclo[5.4.0] undec-7-ene (DBU), salt with DBU and terephthalic acid and salt with 2,6-naphthalenedicarboxylic acid, quaternary ammonium such as tetraethylammonium chloride, tetrapropylammonium chloride, tetrabutylammonium chloride, tetrabutylammonium bromide, tetrahexylammonium bromide, benzyltrimethylammonium chloride, urea compounds such as 3-phenyl-1,1-dimethylurea, 3-(4-methylphenyl)-1,1-dimethylurea, chlorophenylurea, 3-(4-chlorophenyl)-1,1-dimethylurea, 3-(3,4-dichlorophenyl)-1,1-dimethylurea, alkaline agents such as sodium hydroxide, potassium hydroxide, and salts of crown ether such as potassium phenoxide and potassium acetate. Specifically, imidazole compounds and 4-(dimethylamino) pyridine are preferable among these compounds.

As the mixing ratio of an epoxy resins and an aromatic polyester in the epoxy resin composition of the present invention, a mixing ratio of 0.15 to 5 moles of ester groups in the aromatic polyesters per 1 mole of epoxy groups in the epoxy resins is preferable, and 0.5 to 2.5 moles of ester groups in the aromatic polyesters per 1 mole of the epoxy groups in the epoxy resins is more preferable. When the mixing ratio of aromatic polyester is outside the above range, the reaction of epoxy resin and aromatic polyester does not proceed sufficiently, and the effect on dissipation factor and glass transition temperature are insufficient.

The mixing ratio of hardening accelerator is preferably within a range of 0.01 to 5 parts by weight per 100 parts by weight of epoxy resin. When the mixing ratio of hardening accelerator is less than 0.01 parts by weight, the curing reaction rate is low, and when it is over 5 parts by weight, homopolymerization of the epoxy resin occurs, and this may prevent the curing reaction of an epoxy resin by an aromatic polyester.

The epoxy resin composition of the present invention may contain inorganic fillers according to intended application. Examples of the inorganic filler include fumed silica, crystalline silica, alumina, aluminum hydroxide and magnesium hydroxide. When the amount of inorganic filler is particularly large, fumed silica is preferably used. Although either of crushed fumed silica and spherical fumed silica can be used, spherical fumed silica is preferably used so as to increase the amount of fumed silica and to suppress an increase in melt viscosity of a molded material. To increase the amount of the spherical silica, size distribution of the spherical silica is preferably adjusted. The higher the filling factor, the better, in view of flame resistance. The filling factor is particularly preferably at least 65% by weight based on the total amount of the epoxy resin composition in semiconductor encapsulants. In applications such as conductive pastes, conductive fillers such as silver powder and copper powder can be used.

If necessary, various additives such as silane coupling agents, releasants, pigments, and emulsifiers can be used in the epoxy resin composition of the present invention. The epoxy resin composition of the present invention is obtained by uniformly mixing the components described above. For example, an epoxy resin composition for coating is prepared by uniformly mixing an epoxy resin, a curing agent and, if necessary, additives such as organic solvents, fillers, and pigments using a disperser such as a paint shaker.

When the epoxy resin composition of the present invention is used to make cured articles, the cured articles exhibit excellent heat resistance, low dissipation factor, and excellent dielectric properties in high frequency type electronic components in which the frequency is 1 GHz or more and which have recently been much in demand. The epoxy resin composition is suitable for printed circuit boards and semiconductor encapsulants.

A melt-mixing type epoxy resin composition suitable for use in semiconductor encapsulants is prepared by uniformly mixing a mixture of the epoxy resin, aromatic polyester, curing agent, inorganic fillers and, if necessary, other epoxy resins, using an extruder, a kneader, or a roller. In this case, silica is commonly used as the filler. The amount of the filler is preferably within a range from 30 to 95% by weight based on 100 parts by weight of the epoxy resin composition, and particularly preferably at least 70% by weight, in order to improve moisture resistance, and solder cracking resistance, and to decrease the linear expansion coefficient.

An epoxy resin composition of the materials for a printed circuit board, other multilayer boards, and carbon fiber reinforced plastics (CFRP) is prepared by dissolving the epoxy resin composition in an organic solvent to form a varnish-like composition. Examples of the organic solvents are amide system solvents such as N-methyl pyrrolidone, N-methylformamide, N,N-dimethylformamide and N,N-dimethylacetamide, acetone, ketone solvents such as methyl ethyl ketone (MEK), methyl isobutyl ketone, cyclohexanone, ethers solvents such as tetrahydrofuran (THF), 1,3-dioxolane, anisole, aromatic hydrocarbon solvents such as toluene and xylene, monoetherglycol solvents such as ethyleneglycol monomethylether and ethyleneglycol monobutylether. In the case of the solvents, the ratio of the solvents is usually selected within a range of 10 to 70 parts by weight, and preferably within a range of 15 to 65 parts by weight with 100 parts by weight based on the mixture of the epoxy resin composition of the present invention and the solvents. Furthermore, a laminate made of the epoxy resin composition is produced by impregnating a base material such as glass fibers, carbon fibers, polyester fibers, polyamide fibers, alumina fibers, and paper with an epoxy resin composition solution (varnish-like composition) and drying the impregnated base material by heating to form a prepreg, followed by hot press forming.

The present invention significantly improves heat resistance and provides epoxy resin cured articles low dissipation factor to modify the insulating material in high frequency type electrical components and electronic components.

Specifically, the epoxy resin cured articles obtained by curing the epoxy resin composition of the present invention have a glass transition temperature of 160° C. or more, a linear expansion coefficient of $60 \times 10^{-6}$ $C.^{-1}$ or less, no change in quality in the immersion test in solder at 300° C., and minimized dimensional changes due to heating.

DETAILED DESCRIPTION OF THE INVENTION

The present invention will be further described in detail by way of examples and comparative examples. In the following, parts and percentages are by weight unless otherwise specified.

SYNTHESIS EXAMPLE 1

In a flask, 1000 ml of water, 20 g of sodium hydroxide, an aromatic monohydroxy compound, and an aromatic polyhydroxy compound in the amounts shown in the column of Synthesis Example 1 in Table 1 were charged in a nitrogen gas stream and the mixture was stirred by a Pfaudler impeller at 300 r.p.m. for 1 hour. The flask was held at 30° C., and a solution in which acyl halide of aromatic polyvalent hydrocarbon groups as shown in Table 1, was dissolved in 1000 ml of methylene chloride by dropping over 15 seconds and being stirred for 4 hours. The obtained mixture solution was allowed to settle and the aqueous phase was separated and removed. The remaining methylene chloride phase was washed with a 0.5% sodium hydroxide aqueous solution followed by removal of the aqueous phase was repeated 3 times. Furthermore, washing the methylene chloride phase with deionized water and removal of the aqueous phase was repeated 3 times. After the reduction of the washed methylene chloride phase in 400 ml, it was dropped into 1000 ml of heptane over 15 seconds, the precipitated phase was washed with methanol, filtrated, and dried, and polyester (A1) was obtained.

SYNTHESIS EXAMPLES 2 TO 9

Polyester (A2) to (A8) and ester compound (A9) were obtained in the same manner as Synthesis Example 1 according to the raw material compositions in Tables 2 and 3.

SYNTHESIS EXAMPLE 10

11 g of triethylamine and 5.1 g of resorcinol were dissolved in 400 ml of tetrahydrofuran in a flask in a nitrogen gas stream, and a solution in which 5.1 g of isophthaloyl chloride was dissolved in 100 ml of tetrahydrofuran was dropped over 30 minutes while cooled by ice. After stirring for 4 hours, a solution in which 19.9 g of p-acetoxybenzoic acid chloride was dissolved into 100 ml of tetrahydrofuran was dropped into the above solution. After the dropping, the result solution was poured into a 5% concentration of sodium carbonate aqueous solution and the precipitate was suction filtrated and washed with water and methanol and vacuum dried, and polyester (H1) (2900 of the number average molecular weight standardized with polyethylene) represented by the following structural formula was obtained.

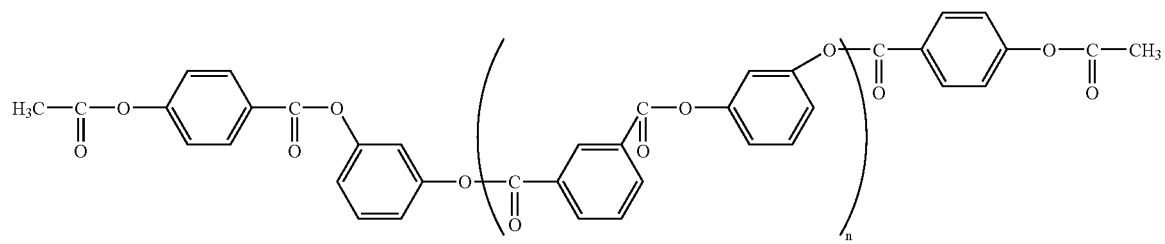

SYNTHESIS EXAMPLES 11

To a flask, 600 ml of pyridine, 105 g of novolak type phenol resin "TD-2090" (hydroxyl group equivalent of 105 g/eq.) manufactured by Dainippon Ink and Chemicals, Inc., and 140.6 g of benzoyl chloride were charged and reacted at 30° C. for 3 hours in a nitrogen gas stream. Then 1500 ml of methyl isobutyl ketone was added and washed with deionized water to remove methyl isobutyl ketone, and polyester (H2) (1300 of the number average molecular weight standardized with polyethylene) which has the repeating unit represented by the following structural formula, was obtained.

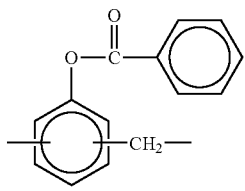

SYNTHESIS EXAMPLE 12

To a flask, 1000 ml of water and 20 g of sodium hydroxide were charged, and 45.7 g of bisphenol A and 1.2 g of tetrabutylammonium bromide were dissolved. The flask was held at 30° C., and 100 ml of methylene chloride solution in which 32.5 g of isophthalic acidchloride and 8.1 g of terephthalic acidchloride were dissolved, was added thereto by dropping for 30 seconds. After stirring for 1 hour, the reaction products were allowed to settle and the aqueous phase was separated and removed. The remaining methylene chloride phase was washed with a 0.5% sodium hydroxide aqueous solution and the aqueous phase was removed and these operations were repeated 3 times. Additionally, washing with deionized water and removal of the aqueous phase were repeated 3 times. After reduction of the washed methylene chloride phase in 400 ml, 1000 ml of heptane was dropped over 15 seconds, the precipitated phase was washed with methanol, filtrated, and dried, and the polyester (H3) (8600 of the number average molecular weight standardized with polyethylene) which has the repeating unit represented by the following structural formula, was obtained.

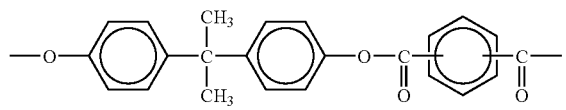

SYNTHESIS EXAMPLE 13

Into a flask, 152 g of trimethylhydroquinone was charged and dissolved into a mixture of solvents of 500 g of toluene and 200 g of ethyleneglycol monoethylether. 4.6 g of p-toluenesulfonic acid was added to the solution and 64 g of benzaldehyde was dropped and the mixture was stirred at 120° C. for 15 hours to remove water contained therein. Then, after cooling, precipitated crystals were filtered out, and washed with water repeatedly until the filtrate was neutral, and dihydroxybenzopyran represented by the following structural formula was obtained.

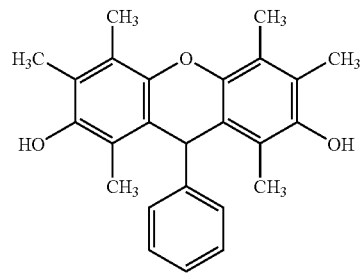

SYNTHESIS EXAMPLE 14

Into a flask, 187 g of dihydroxybenzopyran obtained in Synthesis Example 13, 463 g of epichlorohydrin, 53 g of n-butanol and 2.3 g tetraethylbenzyl ammonium chloride were charged and dissolved in a nitrogen gas stream. The flask was evacuated to the azeotropic pressure of the solution at 65° C. and 82 g of 49% sodium hydroxide aqueous solution was dropped over 5 hours and stirred for 30 min. After removing unreacted epichlorohydrin by reduced pressure distillation, 15 g of 10% sodium hydroxide aqueous solution was reacted with a solution of 550 g of methyl isobutyl ketone and 55 g of n-butanol at 80° C. for 2 hours. The reaction result was washed with water, and the benzopyran type epoxy resin represented by the following structural formula was obtained.

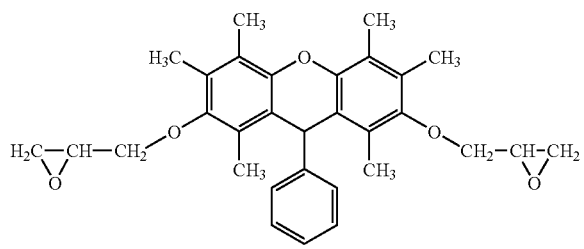

TABLE 1

| | Synthesis Examples | | | | |
|---|---|---|---|---|---|
| | 1 | 2 | 3 | 4 | 5 |
| | Composition (weight (g)) | | | | |
| | A1 | A2 | A3 | A4 | A5 |
| Acyl halide polyvalent hydrocarbon groups | | | | | |
| Isophthalic acid chloride | 20.3 | 32.5 | 20.3 | 20.3 | 20.3 |
| Terephthalic acid chloride | 20.3 | 8.1 | 20.3 | 20.3 | 20.3 |
| Monophenol | | | | | |
| α-naphthol | 3.6 | | 5.2 | | 7.2 |
| β-naphthol | | 5.2 | | | |
| o-phenylphenol | | | | 6.2 | |
| Polyphenol | | | | | |
| DCPDDP | 61.9 | 60.0 | | | 30.0 |
| DHDBP | | | 68.1 | | |
| DHDN | | | | 52.0 | |
| BPFL | | | | | 31.9 |
| n (repeating unit of polyester) | 15 | 10 | 10 | 10 | 10 |
| Inherent viscosity (dL/g) | 0.312 | 0.202 | 0.224 | 0.213 | 0.210 |

TABLE 2

|  | Synthesis Examples | | | |
|---|---|---|---|---|
|  | 6 | 7 | 8 | 9 |
|  | Composition (weight (g)) | | | |
|  | A6 | A7 | A8 | A9 |
| Acyl halide of polyvalent hydrocarbon groups | | | | |
| Isophthalic acid chloride | 20.3 | 20.3 | 20.3 | 20.3 |
| Terephthalic acid chloride | 20.3 | 20.3 | 20.3 | 20.3 |
| Monophenol | | | | |
| α-naphthol | 7.2 | 5.2 | 5.2 | 61.9 |
| β-naphthol | | | | |
| o-phenylphenol | | | | |
| Polyphenol | | | | |
| DCPDDP | 57.8 | 52.8 | 44.0 | |
| DHDBP | | | | |
| DHDN | | | | |
| BPFL | | | | |
| n (repeating unit of polyester) | 7 | 4 | 2 | 0 |
| Inherent viscosity (dL/g) | 0.15 | 0.09 | 0.053 | 0.013 |

Polyphenols shown in Table 1 and Table 2 are defined below. The values in Table 1 are given by weight (g).

Inherent viscosity values were determined, in accordance with Japanese Industrial Standard JIS K2283, with a Canon-Ubbelohde viscometer at 25° C. using 0.5 g/dL solutions in chloroform.

DCPDDP: Dicyclopentadienyl diphenol "DPP-6085" manufactured by Nippon Oil Co., Ltd. (Aromatic polyhydroxy compounds in which k is 0.16 on average in formula (11). Hydroxyl group equivalent of 165 g/eq.)

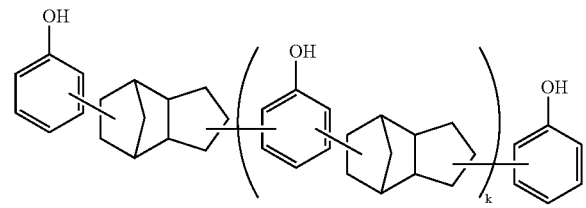

Formula (11)

DHDBP: Dihydroxybenzopyran (which is an aromatic polyhydroxy compound represented by formula (14) obtained by Synthesis Example 9 wherein Y in formula (12) is a methylene group substituted with a phenyl group and n and m are 3. Hydroxyl group equivalent of 187 g/eq.)

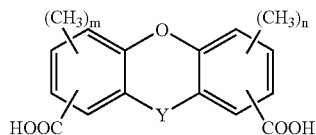

Formula (12)

DHDN: Dihydroxydinaphthalene manufactured by Tokyo Kasei Kogyo Co., Ltd., which is an aromatic polyhydroxy compound represented by formula (13). Hydroxyl group equivalent of 143 g/eq.)

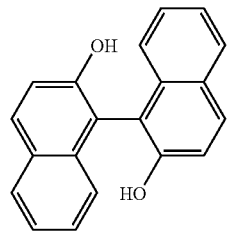

Formula (13)

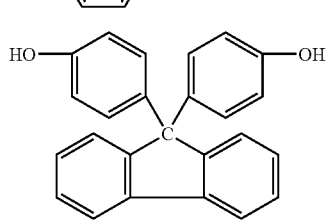

Formula (14)

BPFL: Bisphenolfluorene manufactured by Nippon Steel Chemical Co., Ltd. (aromatic polyhydroxy compound represented by formula (14). Hydroxy equivalent of 175 g/eq.)

EXAMPLES 1 TO 9

Curing agents which were polyesters A1 to A8 obtained in Synthesis Examples 1 to 8, an epoxy resin, a hardening accelerator and a solvent are mixed in compositions as shown in Tables 3 and 4 at 25° C., and a varnish was prepared. The prepared varnish was coated on an aluminum dish, heated to 120° C. to drive off the solvent and become semi-hardened (the B stage) at 170° C. on a hot plate. Then, the semi-hardened coating was peeled from the aluminum dish and made into a powder. The powder was pressed at 170° C. at 3 MPa for 1 hour and was hot cured in a vacuum oven at 190° C. at 133 Pa for 10 hours, and epoxy resin cured articles were obtained.

COMPARATIVE EXAMPLES 1 TO 6

Curing agent which is ester compound A9 obtained by Synthesis Example 9, polyesters H1 to H3 obtained by Synthesis Examples 6 to 8, adipic acid di(nitrophenyl)ester and methyltetrahydrophthalic anhydride, and an epoxy resin, a curing agent, a hardening accelerator, and a solvent are mixed in the compositions as shown in Table 5 and a varnish was prepared. The prepared varnish was coated on an aluminum dish, heated up at 120° C. to drive off solvents and become semi-hardened (the B stage) at 170° C. on a hot plate. Then, the semi-hardened coating was peeled from the aluminum dish and made into a powder. The powder was pressed at 170° C. at 3 MPa for 1 hour and hot cured in a vacuum oven at 190° C. at 133 Pa for 10 hours, and epoxy resin cured articles made therewith were examined.

The glass transition temperature (Tg), dielectric properties, linear expansion coefficient, and heat resistance to solder made from the epoxy resin cured articles obtained in Examples 1 to 9 and Comparative Examples 1 to 6 were measured by the methods described below, and the results are shown in Tables 5 and 6.

Measurement of Glass Transition Temperature (Tg)

Glass transition temperature was measured as peak temperature of tan δ at 1 Hz by a dynamic mechanical analyzer "DMS200" manufactured by Seiko Instruments, Inc.

Measurement of Dielectric Properties

By a method according to Japanese Industrial Standard JIS-C-6481, the dielectric constant at 1 GHz and the dissipation factor were measured by an impedance material analyzer "HP4291B" manufactured by Agilent Technologies. The samples were the epoxy resin cured articles which were stored in a room at 23° C. at 50% humidity after being completely dried, and the epoxy resin cured articles were tested in a moisture resistance test using a pressure cooker test for 2 hours.

Measurement of Linear Expansion Coefficient

Linear expansion coefficient of the epoxy resin cured articles when the temperature was changed from 30 to 50° C. was measured by a thermal mechanical analyzer "TMA/SS120C" manufactured by Seiko Instruments, Inc.

Test of Heat Resistance to Solder

By a method according to Japanese Industrial Standard JIS-C-6481, the condition of epoxy resin cured articles immersed in a solder bath at 300° C. for 120 seconds was inspected visually. In the Tables, "O" means no expansion or cracking was visually observed, and "x" means expansion and cracking were visually observed.

TABLE 3

| | Example | | | | |
|---|---|---|---|---|---|
| | 1 | 2 | 3 | 4 | 5 |
| Epoxy resins | | | | | |
| EPICLON HP-7200H | 100 | 20 | 100 | 100 | |
| EPICLON N-695 | | | | | 100 |
| Benzopyran type epoxy resin | | 80 | | | |
| Curing agents | | | | | |
| polyester A1 | 49 | | | | |
| polyester A2 | | 50 | | | |
| polyester A3 | | | 54 | | |
| polyester A4 | | | | 45 | |
| polyester A5 | | | | | 66 |
| Hardening accelerators | | | | | |
| 2E4MZ | 0.5 | 0.5 | 0.5 | 0.5 | |
| DMAP | | | | | 0.5 |
| Solvents | | | | | |
| 1,3-dioxolane | 160 | | 180 | 180 | 200 |
| toluene | | 170 | | | |
| Glass transition temperature (° C.) | 170 | 178 | 169 | 182 | 196 |
| dielectric constant (1 GHz) | 2.85 | 2.86 | 2.97 | 2.98 | 2.92 |
| dissipation factor ($\times 10^{-4}$, 1 GHz) | 31 | 29 | 38 | 36 | 43 |
| Dielectric constant after moisture absorption (1 GHz) | 2.86 | 2.87 | 3.02 | 3.01 | 3.06 |
| Dissipation factor after moisture absorption ($\times 10^{-4}$, 1 GHz) | 34 | 34 | 45 | 45 | 56 |
| linear expansion coefficient ($\times 10^{-6}$ °C.$^{-1}$) | 56 | 52 | 52 | 51 | 50 |
| Heat resistance to solder | ○ | ○ | ○ | ○ | ○ |

TABLE 4

| | Example | | | |
|---|---|---|---|---|
| | 6 | 7 | 8 | 9 |
| Epoxy resins | | | | |
| EPICLON HP-7200H | 100 | 100 | 100 | 100 |
| EPICLON N-695 | | | | |
| Benzopyran type epoxy resin | | | | |
| Curing agents | | | | |
| polyester A6 | 66 | | | |
| polyester A7 | | 66 | | |
| polyester A8 | | | 67 | |
| polyester A8 | | | | 100 |
| hardening accelerator | | | | |
| DMAP | 0.5 | 0.5 | 0.5 | 0.5 |
| Solvents | | | | |
| 1,3-dioxolane | 200 | 200 | 200 | 200 |
| Glass transition temperature (° C.) | 182 | 165 | 162 | 174 |
| dielectric constant (1 GHz) | 2.92 | 2.94 | 2.93 | 2.93 |
| dissipation factor ($\times 10^{-4}$, 1 GHz) | 38 | 33 | 28 | 42 |
| Dielectric constant after moisture absorption (1 GHz) | 3.07 | 3.08 | 3.08 | 3.08 |
| Dissipation factor after moisture absorption ($\times 10^{-4}$, 1 GHz) | 49 | 39 | 34 | 58 |
| linear expansion coefficient ($\times 10^{-6}$ °C.$^{-1}$) | 50 | 51 | 52 | 52 |
| Heat resistance to solder | ○ | ○ | ○ | ○ |

TABLE 5

|  | Comparative Example | | | | | |
|---|---|---|---|---|---|---|
|  | 1 | 2 | 3 | 4 | 5 | 6 |
| Epoxy resin | | | | | | |
| EPICLON HP-7200H | 100 | | 100 | 100 | 100 | 100 |
| EPICLON N-695 | | 100 | | | | |
| Curing agent | | | | | | |
| Polyfunctional activated ester H1 | 42 | | | | | |
| Polyfunctional activated ester H2 | | 93 | | | | |
| Polyfunctional activated ester H3 | | | 65 | | | |
| Ester componds A9 | | | | 75 | | |
| di(nitrophenyl)ester adipate | | | | | 70 | |
| methyltetrahydrophthalic anhydride | | | | | | 30 |
| hardening accelerator | | | | | | |
| 2E4MZ | 0.5 | 0.5 | 0.5 | 0.5 | 0.5 | 0.5 |
| Solvent | | | | | | |
| 1,3-dioxolane | 500 | 300 | 400 | 400 | 400 | 300 |
| Glass transition temperature (° C.) | 153 | 182 | 185 | 129 | 88 | 171 |
| dielectric constant (1 GHz) | 3.05 | 3.29 | 2.94 | 2.85 | 3.38 | 3.36 |
| dissipation factor ($\times 10^{-4}$, 1 GHz) | 91 | 125 | 104 | 23 | 111 | 116 |
| Dielectric constant after moisture absorption (1 GHz) | 3.10 | 3.43 | 3.08 | 2.88 | 3.55 | 3.61 |
| Dissipation factor after moisture absorption ($\times 10^{-4}$, 1 GHz) | 124 | 188 | 152 | 35 | 273 | 224 |
| linear expansion coefficient ($\times 10^{-6\circ}$ C.$^{-1}$) | 57 | 55 | 56 | 48 | 88 | 51 |
| Heat resistance to solder | ○ | ○ | ○ | ○ | x | ○ |

Epoxy resins are shown in Tables 3 to 5, and hardening accelerators are dexcribed below. The values in Tables 2 and 3 are given by weight (g).

EPICLON HP-7200H: Dicyclopentadiene novolak type epoxy resin manufactured by Dainippon Ink and Chemicals, Inc., (epoxy equivalent of 280 g/eq.)

EPICLON N-695: Cresol novolak type epoxy resin manufactured by Dainippon Ink and Chemicals, Inc., (epoxy equivalent of 225 g/eq.)

Benzopyran type epoxy resin obtained by Synthesis Example 10 and represented by Formula (25) (epoxy equivalent of 265 g/eq.)

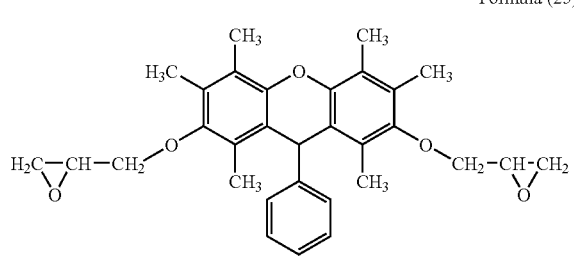

Formula (25)

2E4MZ: 2-ethyl-4-methylimidazole

DMAP: 4-dimethylaminopyridine

As is clear from Tables 3 to 5, epoxy resin cured articles shown in the Comparative Examples could not have a low dissipation factor of no more than $5.0 \times 10^{-3}$ at 1 GHz and could not have high heat resistance with a glass transition temperature of 160° C. or more at the same time. In contrast, epoxy resin cured articles compositions including polyester (A) of the present invention have a low dissipation factor of no more than $5.0 \times 10^{-3}$ at 1 GHz and the change in the dissipation factor by moisture absorption was small. Those cured articles made from epoxy resin compositions including polyester (A) of the present invention have high glass transition temperatures of 160° C. or more and no significant dimensional change by heat was observed. No expansion and cracking by immersion into a solder bath at 300° C. occurred. It was discovered that the epoxy resin compositions required less solvent when varnishes were prepared, and the solubility was excellent.

EXAMPLES 10 TO 16 AND COMPARATIVE EXAMPLE 7

Solubility in solvents of the polyesters A1 to A8 and the ester compound A9 were evaluated. At 25° C., 5 g of one selected from the polyesters A1 to A8 and the ester composition A9 and 20 g or 5 g of solvents, were charged into screw vials and stirred by magnetic stirrers for 12 hours. Mixtures having concentration of 20 wt % or 50 wt % were prepared. When the obtained mixture was homogeneous and transparent and the state which is homogeneous and transparent state without any precipitate was maintained after 2 weeks at 25° C., a "+" (soluble) is given as the evaluation result in Table 6. When a solid portion which did not dissolve and a phase separation were observed, a "−" is given as the evaluation result, and the results are shown in Table 6.

TABLE 6

| | Example | | | | | | | | Comparative |
|---|---|---|---|---|---|---|---|---|---|
| | 10 | 11 | 12 | 13 | 14 | 15 | 16 | 17 | Example 7 |
| | Polyester or ester compounds | | | | | | | | |
| | A1 | A2 | A3 | A4 | A5 | A6 | A7 | A8 | A9 |
| Solubility in toluene | | | | | | | | | |
| conc. = 20 wt % | + | + | + | + | + | + | + | + | − |
| conc. = 50 wt % | − | − | − | − | − | + | + | + | − |
| Solubility in THF | | | | | | | | | |
| conc. = 50 wt % | + | + | + | + | − | + | + | + | − |
| conc. = 20 wt % | + | + | + | + | + | + | + | + | + |
| Solubility in MEK | | | | | | | | | |
| conc. = 20 wt % | − | − | + | + | − | + | + | + | + |
| conc. = 50 wt % | − | − | − | − | − | + | + | + | − |
| Solubility in cyclohexanone | | | | | | | | | |
| conc. = 20 wt % | + | + | + | + | − | + | + | + | + |
| conc. = 50 wt % | + | + | + | + | − | + | + | + | − |

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An epoxy resin composition comprising:
   an epoxy resin; and
   a curing agent which includes an aromatic polyester having a structure wherein an aromatic hydrocarbon group (a1) having a bonding site in an aromatic nucleus derived from a polyhydricphenol and another aromatic hydrocarbon group (a2) having a bonding site in an aromatic nucleus derived from a polyvalent carboxylic acid are bonded via an ester bond (b), and an aryloxy-carbonyl group (c) is the terminal of said polyester, and having an inherent viscosity within a range of 0.02 to 0.42 dL/g.

2. The epoxy resin composition according to claim 1, wherein the aromatic hydrocarbon group (a1) or the aromatic hydrocarbon group (a2) is a polyvalent hydrocarbon group having a structure in which a benzene ring is bonded to another benzene ring via a condensed polyalicyclic hydrocarbon.

3. The epoxy resin composition according to claim 1, wherein the epoxy resin is a polyglycidyl ether of a phenol resin having a structure in which a phenol is bonded to another phenol via a condensed polyalicyclic hydrocarbon.

4. The epoxy resin composition according to claim 1, wherein the aromatic hydrocarbon group (a1) or the aromatic hydrocarbon group (a2) is a bivalent hydrocarbon group having a naphthalene structure.

5. The epoxy resin composition according to claim 1, wherein the aromatic hydrocarbon group (a1) or the aromatic hydrocarbon group (a2) is a bivalent hydrocarbon group having a dibenzopyran structure.

* * * * *